United States Patent
Philips

(10) Patent No.: US 7,510,090 B2
(45) Date of Patent: Mar. 31, 2009

(54) RACK-MOUNTING SYSTEM FOR IMPROVING REDUNDANCY

(75) Inventor: Stephen James Philips, Smithtown, NY (US)

(73) Assignee: Miteq, Inc., Hauppauge, NY (US)

( * ) Notice: Subject to any disclaimer, the term of this patent is extended or adjusted under 35 U.S.C. 154(b) by 0 days.

(21) Appl. No.: 11/705,624

(22) Filed: Feb. 13, 2007

(65) Prior Publication Data

US 2007/0256991 A1    Nov. 8, 2007

Related U.S. Application Data

(60) Provisional application No. 60/772,643, filed on Feb. 13, 2006.

(51) Int. Cl.
*A47F 7/00* (2006.01)

(52) U.S. Cl. ................................... 211/26

(58) Field of Classification Search .............. 211/26, 211/189; 361/724, 683, 681; 312/265.1, 312/265.4
See application file for complete search history.

(56) References Cited

U.S. PATENT DOCUMENTS

| | | | | |
|---|---|---|---|---|
| 5,927,389 A * | 7/1999 | Gonsalves et al. | ......... | 165/121 |
| 6,719,149 B2 * | 4/2004 | Tomino | ........................ | 211/26 |
| 6,888,069 B1 * | 5/2005 | Chen et al. | ................ | 174/99 R |
| 6,906,918 B2 * | 6/2005 | Rabinovitz | ................... | 361/687 |
| 7,187,265 B1 * | 3/2007 | Senogles et al. | ............. | 340/3.5 |
| 2003/0183588 A1 * | 10/2003 | Steinman et al. | .............. | 211/26 |
| 2004/0016708 A1 * | 1/2004 | Rafferty et al. | ............... | 211/26 |
| 2004/0094983 A1 * | 5/2004 | Bortell | .................... | 296/26.12 |

OTHER PUBLICATIONS

International Search Report, Jul. 2, 2008, 2 pages.
Written Opinion, Jul. 2, 2008, 4 pages.

* cited by examiner

*Primary Examiner*—Sarah Purol
(74) *Attorney, Agent, or Firm*—Lackenbach Siegel, LLP; Myron Greenspan

(57) ABSTRACT

A rack-mounting system includes a rack with a number of shelves for mounting electronic modular components. At least two modular components are mounted on each shelf, each component with width approximately equal to W/n, where W equals the width of the shelf and n equals the maximum number of modular components to be mounted on a single shelf. Each modular component is fully self-contained, stand-alone, and operates with full independence of the other self-contained, stand-alone components. At least two modular components have the same function. Means is provided for switching out a defective component and switching in a standby component that performs the same function, thus enhancing redundancy.

16 Claims, 7 Drawing Sheets

1:1 redundant system configuration

Input and output switches

Input switch

1:2 redundant system configuration

1:1 redundant system configuration
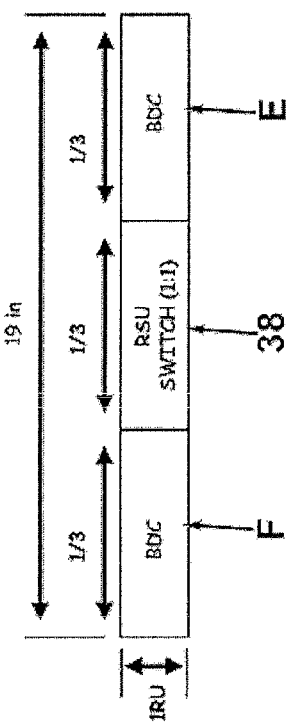
Fig. 9
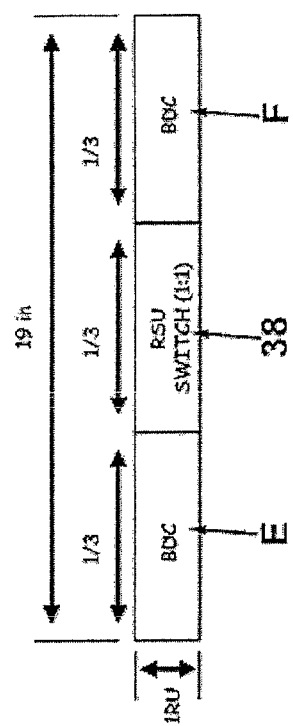
Fig. 11
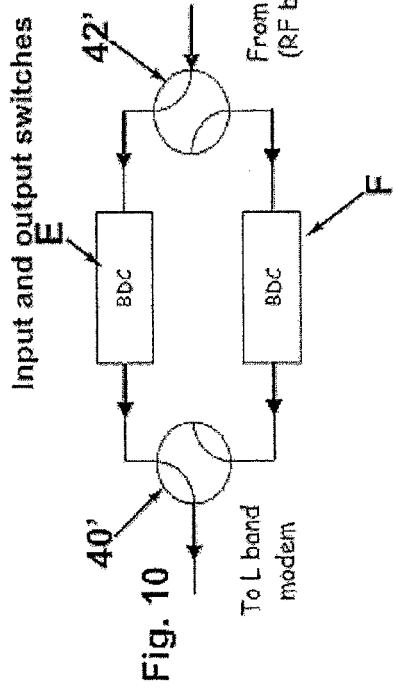
Fig. 10 Input and output switches
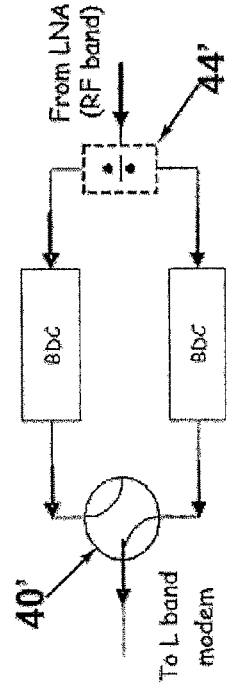
Fig. 12 Output switch

1:2 redundant system configuration

RACK-MOUNTING SYSTEM FOR IMPROVING REDUNDANCY

CROSS REFERENCE TO RELATED APPLICATION

This application is based on Provisional Patent Application No. 60/772,643 filed on Feb. 13, 2006, and claims priority thereof.

BACKGROUND OF THE INVENTION

1. Field of the Invention

The present invention generally relates to rack-mounting systems and, more particularly, to increasing redundancy and mean-time between failures (MTBF).

2. Description of the Prior Art

Rack-mounting systems have been known and used for many years to mount numerous types of electronic and electrical modular components. Typically, the racks have a standard width, and the electrical or electronic modular components that are mounted on the rack have similar widths so that each component can be inserted into a bay of a rack and attached to the frame of the rack-mounting system to secure it in place. Typically, the modular components are provided with front panels that form end or lateral flanges, which extend beyond the width of the housing of the modular components. These panels are arranged and aligned with portions of the frame in such a manner such that they can be secured by means, for example, of bolts, screws or other fastening devices to the frame.

In a typical rack-mounted setup, the various bays or shelves of the rack are filled with diverse electrical or electronic components that are interconnected with each other at the rear of the units and with other inputs and/or outputs. Thus, for example, when used in conjunction with audio systems, one bay of the rack may be a low-noise preamplifier, another bay occupied by a power amplifier, while a third bay might include a frequency equalizer. It is clear that in different fields or applications, such racks are populated by specialized modular components needed for a given application. Thus, in the field of satellite communications, such modular components may include block upconverters, block downconverters, test translators, switchover units, and the like.

A problem in prior applications is that different or similar modular components have frequently shared common functional elements or blocks, such as a power supply used to power two or more modular components. For this reason, when one of such common functional elements failed, an entire system could fail, in which case the defective portions of the system would have to be replaced before the system could be "up and running" again. This would require standby staff that would physically replace a defective unit with a new one. Also, this inevitably resulted in a down time for the entire system. When dealing with satellite communication systems, down time is not normally acceptable, and systems need to have a degree of redundancy so that failure of one component does not down the system, but rather a replacement component is quickly and seamlessly inserted where the failed component existed.

SUMMARY OF THE INVENTION

Accordingly, it is an object of the present invention to provide a rack-mounting system that does not possess the disadvantages inherent in prior art rack mounting-systems.

It is still another object of the invention for improving redundancy in those rack-mounting systems.

It is yet another object to provide a rack-mounting system as in the previous objects that increases the time between failures and minimizes down time.

It is an additional object of the invention to provide a rack-mounting system of the type under discussion that is usable in a wide range of applications in which reliability and continuity of operation are important or essential.

In order to achieve the above objects, as well as others that will become apparent hereinafter, a rack-mounting system in accordance with the present invention comprises a rack, including a plurality of shelves having a width W, for mounting electronic modular component. At least two modular components are mounted on each of the rack shelves, and each have a width approximately equal to W/n, where W is equal to the width of the shelf and n is equal to the maximum number of modular components to be mounted on a single shelf of the rack. Each modular component is a fully self-contained, stand-alone component that is fully operational independent of the status of the other self-contained and stand-alone components on the rack. At least two modular components on the rack have the same functionality. Switchover means is provided for switching out a defective modular component and switching in a standby modular component of the same functionality thus providing a redundant system and increasing the MTBF.

BRIEF DESCRIPTION OF THE DRAWINGS

Various further objects, features and attendant advantages of the present invention will be fully appreciated as the invention is better understood in light of the accompanying figures, in which like reference numbers or characters designate the same or similar parts within the figures, and wherein:

FIG. 9 is similar to FIG. 3, for illustrating a different set of modular components providing a 1:1 redundant system configuration;

FIG. 10 is similar to FIG. 4 for the arrangement shown in FIG. 9;

FIG. 11 is similar to FIG. 5 but for a different component configuration;

FIG. 12 is similar to FIG. 6 for the configuration as shown in FIG. 11;

DETAILED DESCRIPTION OF THE PREFERRED EMBODIMENTS

Figure 1:
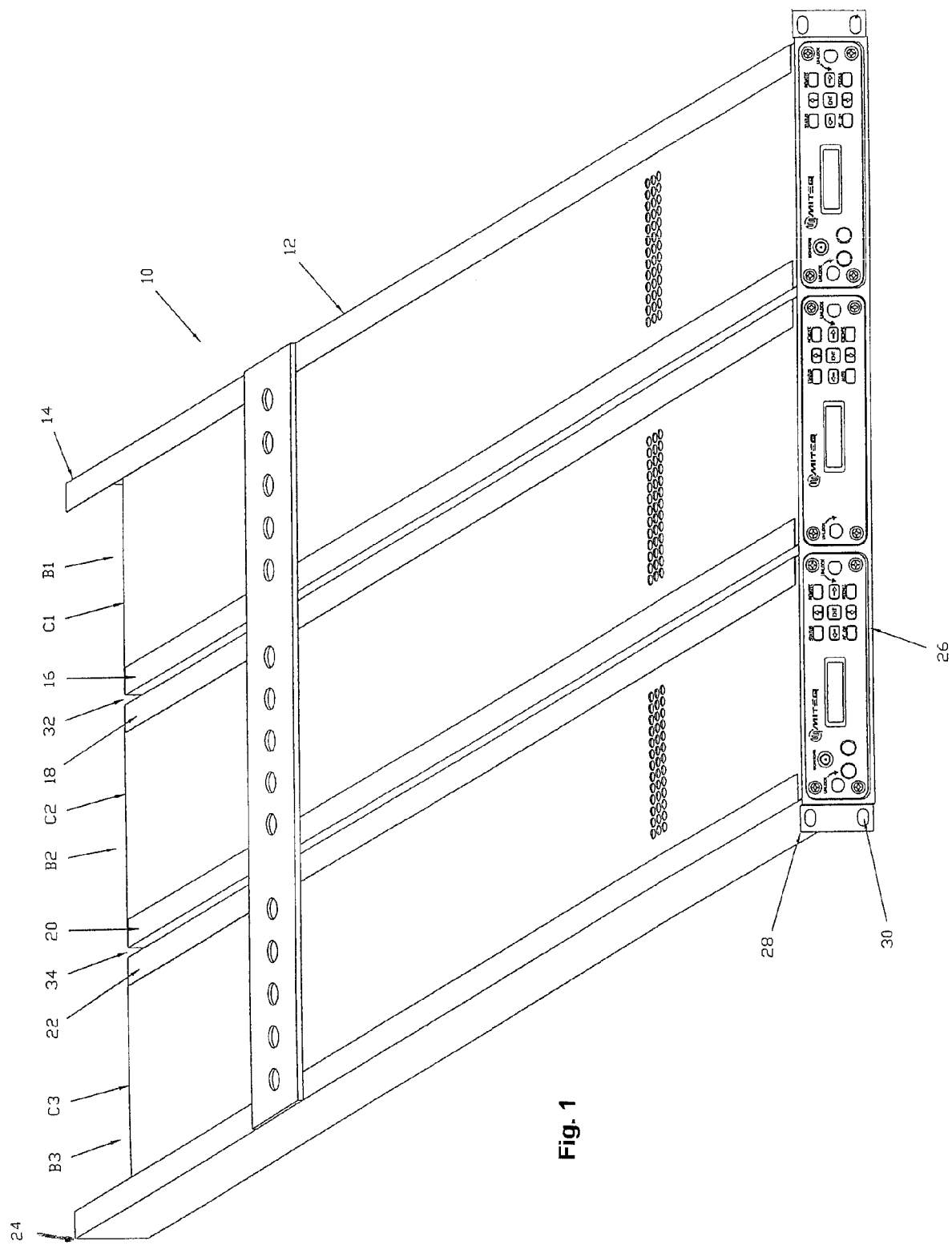
FIG. 1 is a perspective of a single shelf of rack in accordance with the present invention shown with three modular components mounted thereon.
Figure 2:
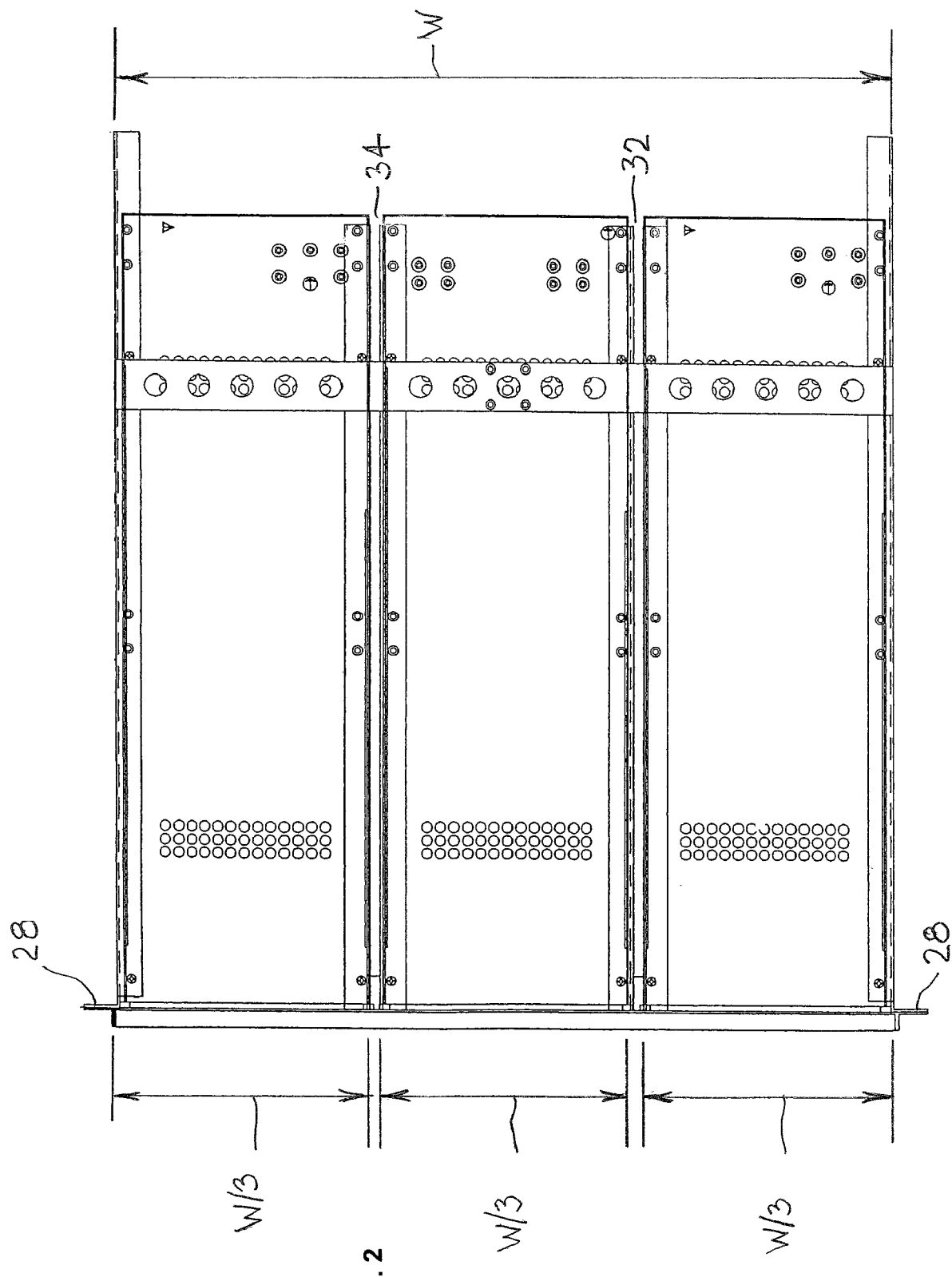
FIG. 2 is a top plan view of the rack and modular components shown in FIG. 1.

Turning now to the drawings in which identical or similar parts are designated by the same reference numerals throughout, and first referring to FIGS. 1 and 2, a single shelf of rack system is generally designated by the reference numeral 10. It will be understood that a rack system typically includes a plurality of vertically spaced or arranged shelves 12.

The rack shelf 12 includes a rack frame including three sets of lateral frame members—14, 16; 18, 20; and 20, 24—for creating three adjoining bays B1, B2, B3 for respectively receiving modular components C1, C2 and C3. The frame includes a front support member 26 that includes lateral flanges 28 provided with suitable mounting holes 30 commonly used in such systems that can be lined with and secured to a conventional rack support member by means of screws, bolts and other like fasteners.

An important feature of the invention is that each of the modular components C1, C2, C3 has a width approximately equal to W/n, where W is the width of the overall rack shelf 12 and n is equal to the maximum number of modular components C1, C2, C3 that can be mounted on the rack frame 12. In the embodiment shown in FIGS. 1 and 2, there is a maximum of three modular components, so that each modular component C1, C2, C3 each has a width approximately equal to one-third of the width W of the frame 12 of the rack between lateral members 14 and 24. Typically, the modular components will have a width somewhat smaller to provide clearances or spaces for ease of mounting as shown or suggested by the gaps 32, 34 between the lateral members 16, 18 and 20, 22, respectively.

It is also an important feature of the invention that each of the modular components C1, C2, C3 be a fully self-contained, standalone component that is fully operational independent of any of the other modular components mounted on the rack. Therefore, notwithstanding their substantially reduced sizes, each of the modular components C1, C2, C3 must have independent input and output ports, a power supply and any other input and output ports needed for operation within the overall system.

Figure 3:
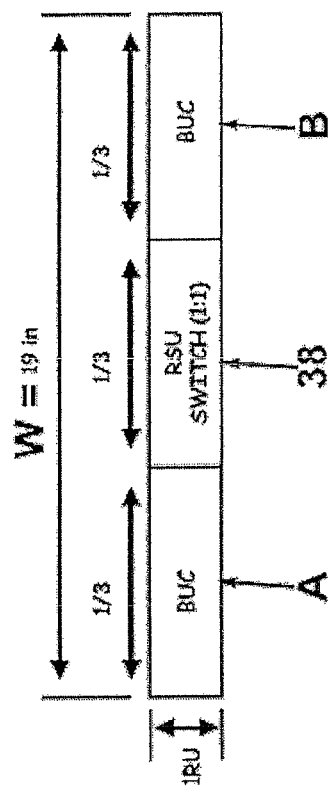
FIG. 3 is a schematic representation of three specific modular components used in the satellite communications field mounted on a shelf of a rack as suggested in FIGS. 1 and 2 and indicating the functionality of each of the components to provide a 1:1 redundant system configuration.
Figure 4:
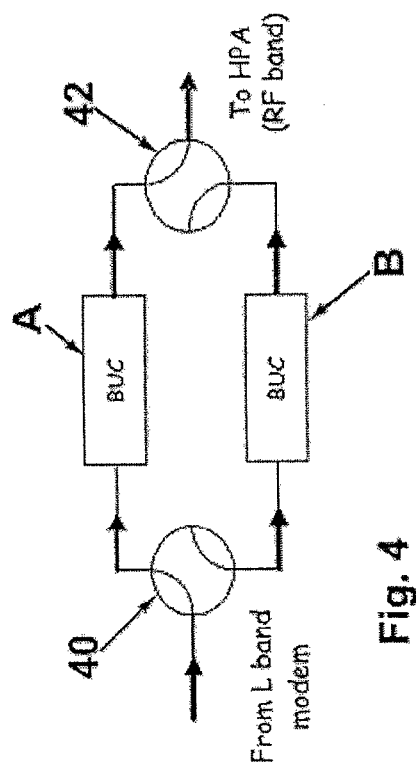
FIG. 4 is a schematic electrical diagram of the modular components shown in FIG. 3.

Referring to FIG. 3, for example, the rack shelf 12, when used in a satellite communication system, may include two block upconverters (BUCs) A, B and a redundant switchover unit (RSU) 38. The units A, B and 38 are shown to be approximately one-third each of the overall width W=19 inches of the shelf 12. The heights of the modular components A, B, 38 are all equal to one rack unit (RU), as may be standard for the industry or for the modules being used. Referring also to FIG. 4, the arrangement shown in FIG. 3 is for a 1:1 redundant system configuration. The RSU 38 includes an input switch 40 connected to both block upconverters A, B and output switch 42. Signals received from, for example, an L-band source, such as a modem, are routed by means of input switch 40. With this arrangement, a signal received from an appropriate L-band source is initially routed, by means of input switch 40 to block upconverter A, where the upconverted frequency band is directed to the output switch 42 to an appropriate output amplifier for transmission. However, if block upconverter A fails for any reason, the RSU 38 senses such failure and causes the input switch 42 to instead route the L-band signal to the block upconverter B. Now output switch 42 also needs to be switched so that it receives the output frequency band from the block upconverter B to again direct the upconverted band to a suitable high-power amplifier in the RF band for transmission to, for example, a satellite. This arrangement clearly provides a 1:1 redundant system, and the overall system configuration remains functional notwithstanding the failure of the initial block upconverter A.

Figure 5:
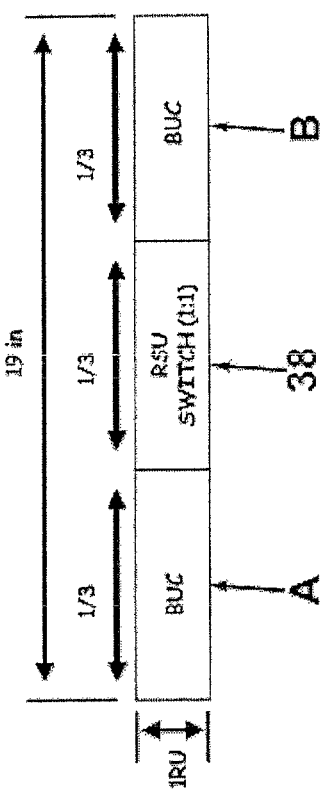
FIG. 5 is similar to FIG. 3, for a different electronic configuration for achieving the same objective as with the arrangement shown in FIGS. 3 and 4.
Figure 6:
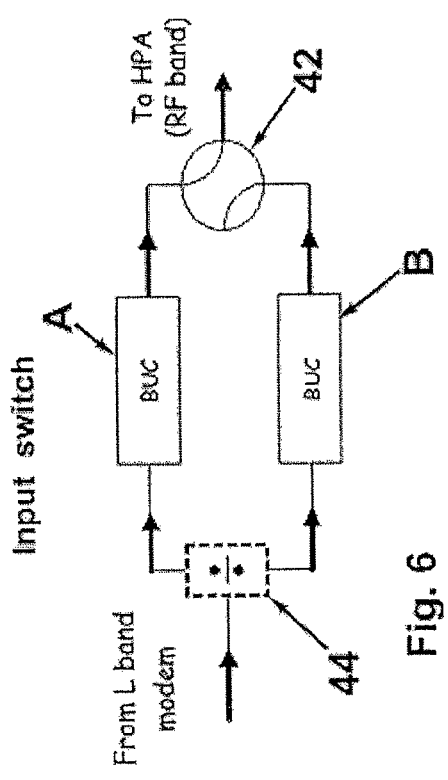
FIG. 6 is a schematic electrical diagram of the arrangement shown in FIG. 5.

In FIGS. 5 and 6 a similar arrangement is shown. Here the redundant switchover unit 38 is provided with an input switch 44 that can be used to control the direction of the signal from L-band and the input to one of the block upconverters A, B.

Figure 7:
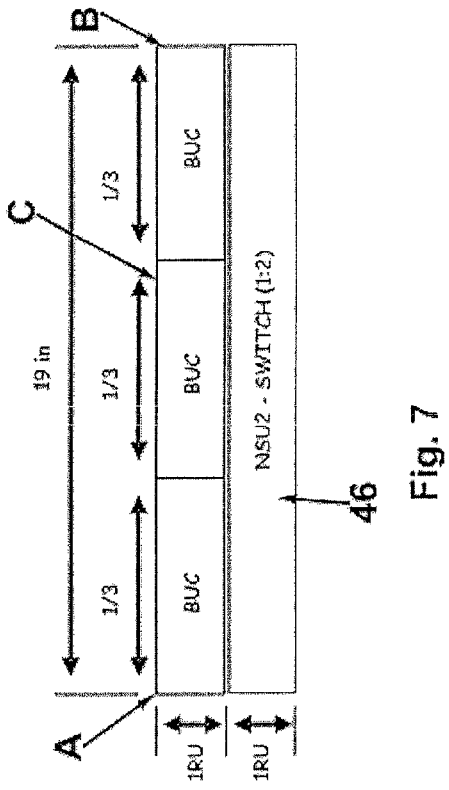
FIG. 7 is a schematic representation of a rack system application that provides a 1:2 redundant system configuration.

Referring to FIG. 7 two stacked rack shelves are shown, each a single rack unit (RU) high, and each used in conjunction with three block upconverters A, B and C, together with an n-switching unit (NSU2) 46 for switching multiple units A, B and C. Each of the block upconverters A, B and C has a width approximately equal to one-third of the width W of the overall rack shelf. The NSU2 unit 46 is shown to occupy an entire width W of the rack, although such a unit can also be reduced in width to W/3. In that event, if desired, the NSU2 unit 46 can also be mounted with two additional one-third rack modular components on the same shelf 12.

Figure 8:
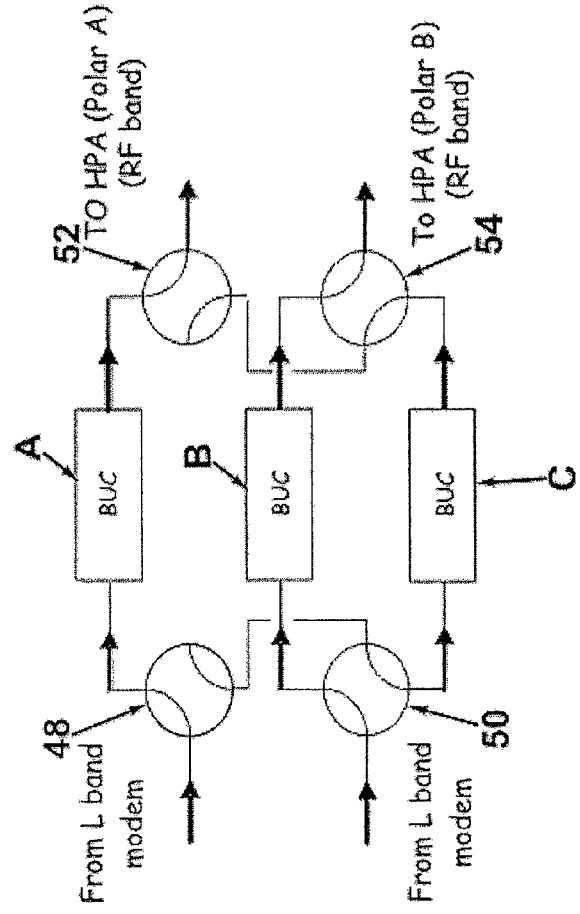
FIG. 8 is a schematic electrical representation of the arrangement shown in FIG. 7.

In FIG. 8 the NSU2 unit 46 is shown to include input switches 48, 50, receiving signals, for example, from L-band modems, and output switches 52, 54 that selectively route upconverter frequencies to high-power amplifiers in the RF band for suitable transmission, for example, to a satellite. It will be evident that the system depicted in FIGS. 7 and 8 forms a 1:2 redundant system configuration, so that there are two standby block upconverters B, C to the initial active block upconverter A. Should the upconverter A fail, such failure is sensed and the MSU2 unit 46 switches the input signal to the block upconverter B by means of switches 48, 50. Likewise, if the block upconverter B fails, the input signal is then routed to block upconverter C. In each case the output switches 52, 54 are also controlled so that a suitable output signal is obtained from one of the functional block upconverters and directed to RF band components such as High Power Amplifiers (HPA).

Referring to FIGS. 9 and 10, similar configurations to those shown in FIGS. 3 and 4 are illustrated. For instance, block downconverters E, F are utilized in a 1:1 redundant system configuration with an RSU 38. This system configuration includes both input and output switches 40', 42'.

FIGS. 11 and 12 are similar to FIGS. 5 and 6, in which block downconverters E, F, H are used but with a single output switch 44'. Of course, with the previously illustrated embodiments, the range of switches (40, 40'), (42, 42'), (44, 44'), (48, 48'), (50, 50'), (52, 52') and (54, 54') all need to operate at the frequency bands that they control.

Figure 13:
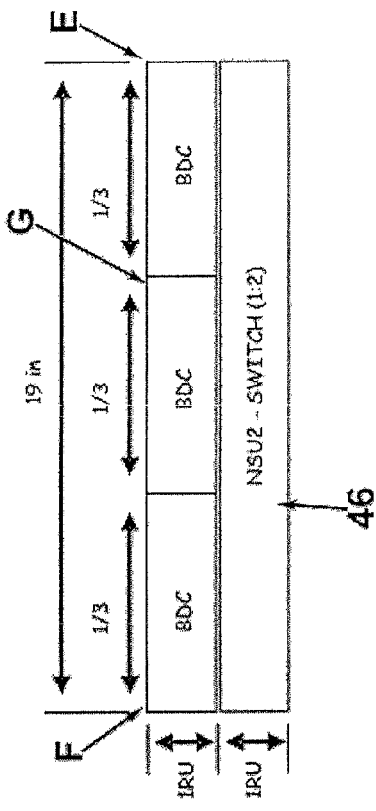
FIG. 13 is similar to FIG. 7 but for a different set of modular components providing a 1:2 redundant system configuration.
Figure 14:
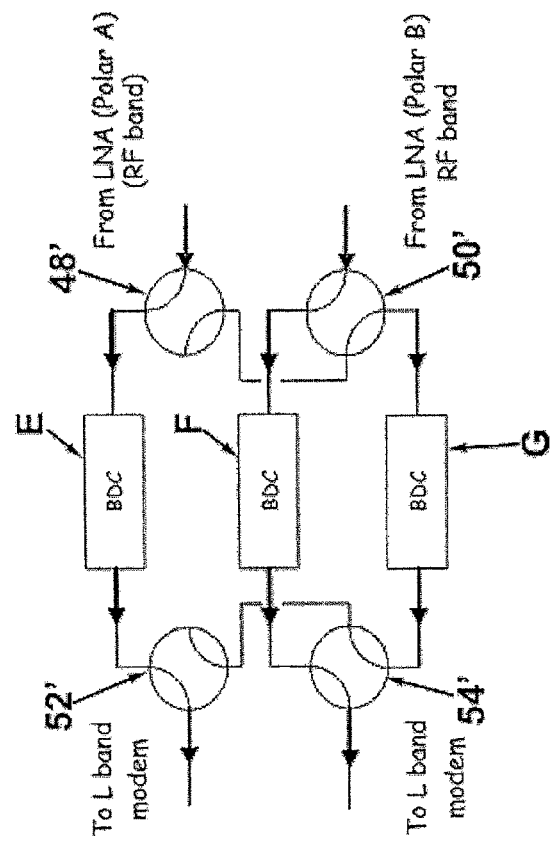
FIG. 14 is similar to FIG. 8 for the components shown in FIG. 13.

FIGS. 13 and 14 are similar to FIGS. 7 and 8, but using the block downconverters E, F, G in a 1:2 redundant system configuration, where the primed reference numerals are similar to the reference numerals shown in FIG. 8.

Figure 15:
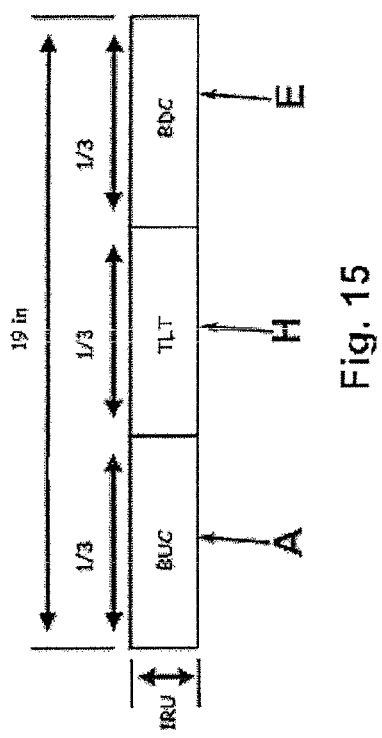
FIG. 15 illustrates still another set of modular components usable with the invention.
Figure 16:
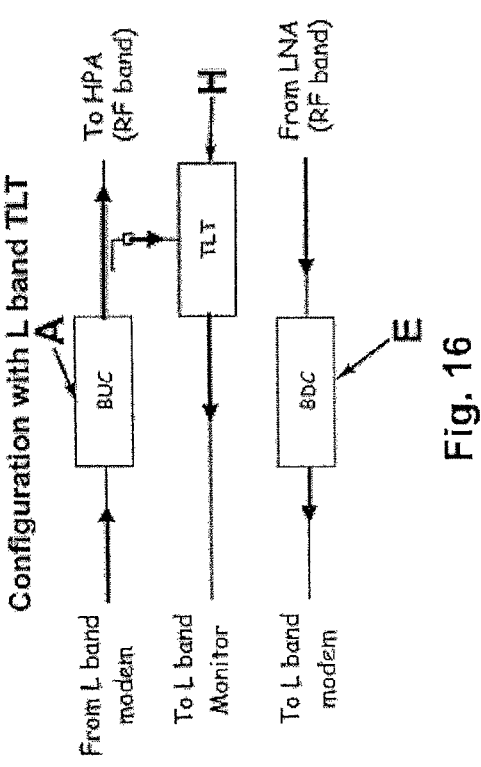
FIG. 16 is a schematic electrical diagram of the modular components shown in FIG. 15.

In FIGS. 15 and 16 other arrangements are illustrated for the rack-mounting system in accordance with the present invention. Because the modular components are smaller than the conventional components, almost an entire redundant system can be mounted on a single rack shelf. Thus, in FIGS. 15 and 16, three modular components A, E and H are mounted on a single shelf, in which component A is a block upconverter, component E is a block downconverter and component H is a test translator.

In FIG. 16, the electrical diagram is schematically shown, illustrating a signal from an L-band first being directed to the block upconverter A, the output of which is directed to a high-frequency amplifier in RF band for suitable transmission. A portion of the upconverter input is directed by a coupler 50 to an input of the translator H to an L-band monitor. A signal from a low-noise amplifier in RF band received from a satellite, for example, is directed to the block downconverter E. The lower-frequency band is directed to an L-band modem. The general operation of these components is well-known to those skilled in the art. However, what is significant in the present invention is that all three of these one-third rack components A, E and H can now be housed on a single rack shelf. Preferably, as suggested above, the overall rack can now contain additional, redundant modular components such as block upconverters and block downconverters so that failure of any one of those can be immediate addressed with the substitution of a fully operational unit.

Figure 17:
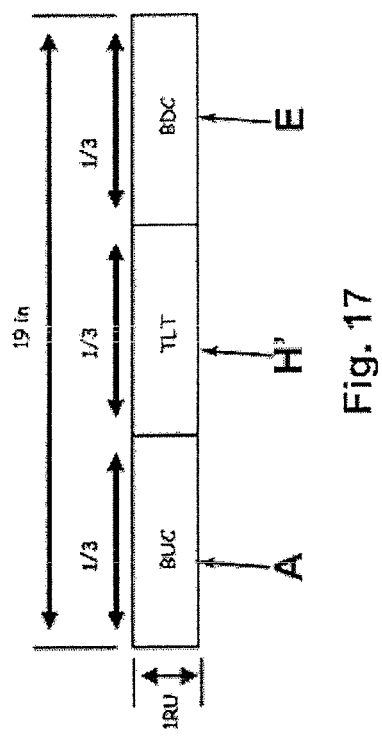
FIG. 17 is similar to FIG. 15 but for a different modular configuration.
Figure 18:
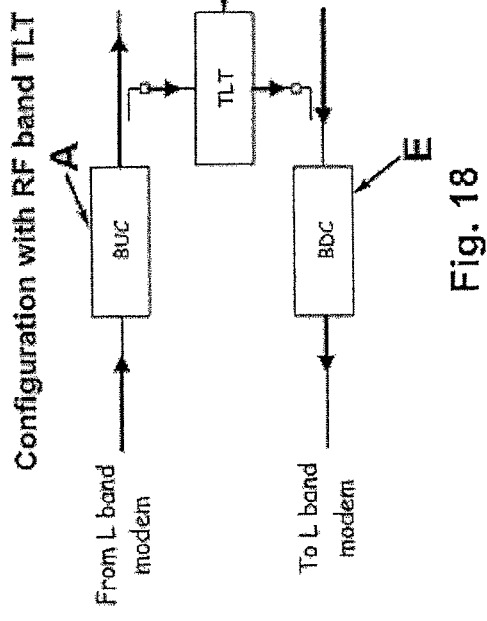
FIG. 18 is a schematic electrical diagram of the modular components shown in FIG. 17.

In FIGS. 17 and 18, the same rack arrangement uses an RF band test translator H', while an L-band test translator H is shown in FIG. 16. In all instances, as described, each of the modular components is approximately one-third of the width W of the rack so that a maximum of three components can be mounted on one rack shelf. As will be evident, the invention can be extended to a number of modular components other than three to a rack shelf. Thus, significant advantages are obtained when two components, each one-half the width of the rack shelf, are mounted on the rack. One-third rack components, however, are preferable. It will clear to those skilled in the art that the more components on a rack, the easier it will be to improve redundancy and increase the Mean Time Between Failures for a system. However, because each modular component must be a fully self-contained and stand-alone component, and is fully operational independent of the other self-contained and stand-alone components, it is contemplated that—with current fabrication technologies—such fully operational and self-contained and stand-alone components can practically be produced when each such modular component is approximately one-third of a 19" rack, or approximately 6" in width.

Although the present invention has been described in conjunction with modular components useful for satellite communications, it will be evident that the same benefits can be obtained from the invention in other applications or technologies where improved redundancy or Mean Time Between Failures are desirable.

What is claimed:

1. A rack-mounting system comprising
    a rack including at least one shelf for mounting electronic modular components and having a width W;
    at least two modular radio frequency (RF) components mounted on said at least one shelf, each component having a width approximately equal to W/n, where W is equal to the width of the shelf and n is equal to the maximum number of modular components to be mounted on a single shelf of the rack,
    each modular component being a fully self-contained, stand-alone component that is fully operational independent of the other self-contained and stand-alone components mounted on the rack and at least two modular components on the rack having the same functionality; and
    RF switchover means for switching out a defective modular component and switching in another modular component of the same functionality to enhance the redundancy of the system.

2. A rack-mounting system as defined in claim 1, wherein n=3.

3. A rack-mounting system as defined in claim 1, wherein W is equal to approximately 19".

4. A rack-mounting system as defined in claim 1, wherein said modular components have a height approximately equal to one rack unit.

5. A rack-mounting system as defined in claim 1, wherein the rack-mounting system is a satellite communication system, and said components on a single shelf of the rack unit includes two block upconverters (BUCs) and a redundant switching unit (RCU) to provide a 1:1 redundant system configuration.

6. A rack-mounting system as defined in claim 1, wherein the rack-mounting system is a satellite communication system, and wherein two stacked rack shelves are each approximately a single rack unit high, three block upconverters (n=3) are mounted on a first shelf, and an n-switching unit (NSUZ) is mounted on the other shelf and associated with said three block upconverters to form a 1:2 dedundant system configuration.

7. A rack-mounting system as defined in claim 1, wherein the rack-mounting system is a satellite communication system, and said components on a single shelf of the rack unit includes two block downconverters (BDC) and a redundant switching unit (RCU) to provide a 1:1 redundant system configuration.

8. A rack-mounting system as defined in claim 1, wherein the rack-mounting system is a satellite communication system, and wherein two stacked rack shelves are each approximately a single rack unit high, three block downconverters (BDC) are mounted on a first shelf, and an n-switching unit (NSUZ) is mounted on the other shelf and associated with said three block downconverters to form a 1:2 redundant system configuration.

9. A rack-mounting system as defined in claim 1, wherein the rack-mounting system is a satellite communication system, and wherein n=3 with the components including an L-band test translator (TLT), a block upconverter (BUC) and one block downconverter (BDC).

10. A rack-mounting system as defined in claim 1, wherein the rack-mounting system is a satellite communication system, and wherein n=3 with the components including an RF-band test translator (TLT), a block upconverter (BUC) and one block downconverter (BDC).

11. A rack-mounting system as defined in claim 1, wherein n=2 and the width of each component mounted on a single shelf is approximately W/2.

12. A rack-mounting system as defined in claim 1, wherein W is equal to approximately 19" and the components are approximately 6".

13. A rack-mounting system as defined in claim 1, wherein input switches connect inputs of a plurality of RF components comprising block upconverters.

14. A rack-mounting system as defined in claim 1, wherein said RF switchover means comprise L-band switches.

15. A rack-mounting system as defined in claim 1, wherein output switches connect outputs of a plurality of RF components comprising block upconverters.

16. A rack-mounting system as defined in claim 1, wherein n=3 and each component has a width somewhat less than W/3 to compensate interface clearances and mounting hardware.

* * * * *